United States Patent
Moyal et al.

(10) Patent No.: US 7,295,049 B1
(45) Date of Patent: Nov. 13, 2007

(54) METHOD AND CIRCUIT FOR RAPID ALIGNMENT OF SIGNALS

(75) Inventors: Nathan Moyal, West Linn, OR (US); Jonathon C. Stiff, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 31 days.

(21) Appl. No.: 11/088,028

(22) Filed: Mar. 22, 2005

Related U.S. Application Data (60) Provisional application No. 60/556,716, filed on Mar. 25, 2004.

(51) Int. Cl.
*H03L 7/06* (2006.01)

(52) U.S. Cl. .................................. 327/141; 327/149

(58) Field of Classification Search ............... 327/141, 327/147, 149, 152–156, 158, 161, 291, 298–299
See application file for complete search history.

(56) References Cited

U.S. PATENT DOCUMENTS

| | | | | |
|---|---|---|---|---|
| 5,491,458 A | | 2/1996 | McCune | 332/144 |
| 5,614,861 A | * | 3/1997 | Harada | 329/308 |
| 5,651,035 A | | 7/1997 | Tozun | 375/373 |
| 5,745,011 A | | 4/1998 | Scott | 331/44 |
| 5,886,582 A | | 3/1999 | Stansell | 331/1 A |
| 5,889,936 A | | 3/1999 | Chan | 375/183.15 |
| 5,952,888 A | | 9/1999 | Scott | 331/2 |
| 6,140,853 A | | 10/2000 | Lo | 327/157 |
| 6,172,571 B1 | | 1/2001 | Moyal | 331/11 |
| 6,211,741 B1 | | 4/2001 | Dalmia | 331/11 |
| 6,272,646 B1 | | 8/2001 | Rangasayee | 713/500 |
| 6,307,413 B1 | | 10/2001 | Dalmia | 327/166 |
| 6,310,521 B1 | | 10/2001 | Dalmia | 331/11 |
| 6,369,660 B1 | | 4/2002 | Wei | 331/15 |
| 6,377,646 B1 | | 4/2002 | Sha | 375/376 |
| 6,434,187 B1 | | 8/2002 | Beard | 375/219 |
| 6,445,211 B1 | | 9/2002 | Saripella | 326/83 |
| 6,466,078 B1 | | 10/2002 | Stiff | 327/536 |
| 6,553,057 B1 | | 4/2003 | Sha | 375/130 |
| 6,560,306 B1 | | 5/2003 | Duffy | 375/376 |
| 6,667,642 B1 | | 12/2003 | Moyal | 327/156 |
| 6,683,930 B1 | | 1/2004 | Dalmia | 375/376 |
| 6,690,224 B1 | | 2/2004 | Moore | 327/296 |
| 6,704,381 B1 | | 3/2004 | Moyal | 375/374 |
| 6,782,068 B1 | | 8/2004 | Wilson | 375/376 |
| 6,784,821 B1 | * | 8/2004 | Lee | 341/155 |
| 6,798,299 B1 | | 9/2004 | Mar | 331/17 |
| 6,850,554 B1 | | 2/2005 | Sha | 375/140 |
| 7,103,108 B1 | | 9/2006 | Beard | 375/295 |
| 7,138,841 B1 | | 11/2006 | Li | 327/175 |
| 2004/0036762 A1 | * | 2/2004 | Nihei et al. | 347/250 |

* cited by examiner

*Primary Examiner*—Linh My Nguyen
(74) *Attorney, Agent, or Firm*—Brownstein Hyatt Farber Schreck, P.C.

(57) ABSTRACT

Circuits and methods for aligning two or more signals including a first and second signal. In one embodiment, a shift register generates two or more shifted copies of the second signal, and each of a plurality of phase detectors receives the first signal and one of the shifted copies of the second signal, each phase detector providing an output indicating whether the first signal is substantially aligned with the shifted copy of the second signal. A multiplexer may also be provided for receiving each of the shifted copies of the second signal, the multiplexer having a plurality of select lines coupled with the output signals of the phase detectors. Some embodiments may include a power saving mode.

18 Claims, 7 Drawing Sheets

METHOD AND CIRCUIT FOR RAPID ALIGNMENT OF SIGNALS

CROSS REFERENCE TO RELATED APPLICATION

This application claims priority under 35 U.S.C. 119(e) to U.S. provisional patent application Ser. No. 60/556,716 filed Mar. 25, 2004 and entitled "Method of Rapid Digital Phase Alignment," the disclosure of which is hereby incorporated by reference in its entirety.

FIELD OF THE INVENTION

This invention relates, in general, to electronic circuits, and in particular to circuits for aligning two signals.

BACKGROUND OF THE INVENTION

Phase alignment is a commonly used technique among designers. Digital phase alignment comprises aligning the edges (rising or falling) of two square wave signals with equal (or integer multiple) frequencies with an arbitrary phase offset. In this case, phase may be characterized as a fraction of signal period given in terms of percent, degrees, or radians. Typically, the phase offsets obtained in digital phase alignment comprise a range of discrete values (for example 0, 45, 90 degrees) but this range can also include other non-discrete values or amounts.

Figure 1:
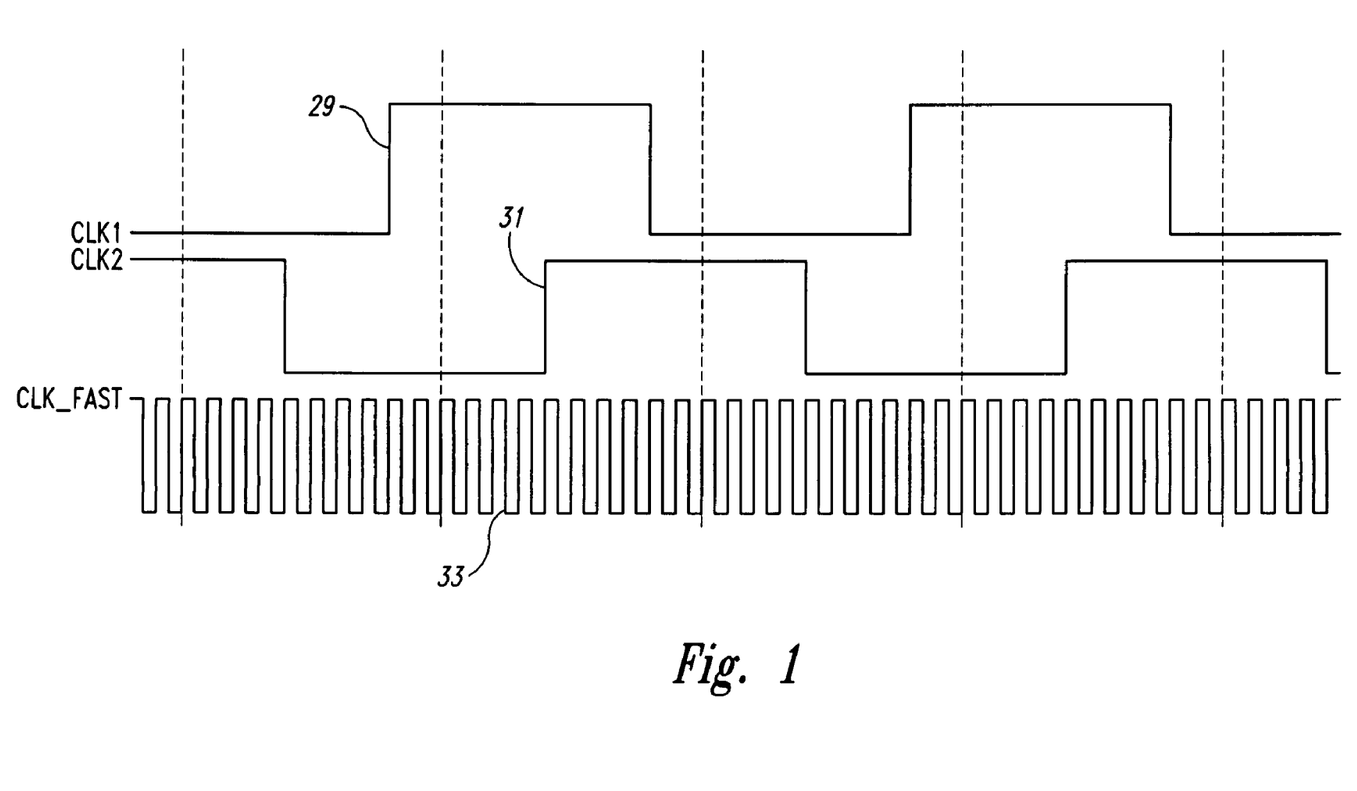
FIG. 1 illustrates an example of two waveforms CLK1 and CLK2 to be aligned with respect to one another and to be synchronized with a faster clock signal CLK3.

As recognized by the present inventors, there may be situations that require fast alignment of two or more signals, such as clock signals. FIG. 1 shows an example of two synchronous clock signals, CLK1 and CLK2 (from the top), with a fast clock CLK3 shown below. The CLK3 frequency may be an integer multiple greater than the sequence of the CLK1 or CLK2 signals (for example 10×).

One conventional phase alignment approach is to use a counter that measures the time delay from the rising edge of CLK1 to CLK2, using CLK3 cycles. CLK1 is advanced according to the number of CLK3 cycles accumulated. A disadvantage of this solution is that a substantial number of CLK3 cycles may need to be counted from the beginning of the phase alignment operation, making the process take up to one CLK1 cycle to complete, which may render this solution impractical.

A second conventional phase alignment approach is to use a delay lock loop (DLL) to re-align the edges of the two clocks. The disadvantage of the DLL solution is that it is much slower achieving phase alignment, requiring several CLK1 cycles to maintain loop stability.

As recognized by the present inventors, what is needed is a method and system for alignment of two or more signals in a rapid manner, such as in a time period less than 1 clock cycle of the CLK1 or CLK2 signals.

It is against this background that various embodiments of the present invention were developed.

SUMMARY

In light of the above and according to one broad aspect of one embodiment of the present invention, disclosed herein is a method for aligning a first signal with a second signal. In one example, the method may include creating two or more shifted copies of the second signal, and determining which of the shifted copies of the second signal are substantially aligned with the first signal. In this way, the first signal can be aligned with a shifted copy of the second signal in a rapid manner.

In one example, the two or more copies of the second signal may be each shifted by a different amount of time. For instance, the two or more copies of the second signal may each be shifted by one or more cycles of a clock signal, the clock signal being of higher frequency than the second signal.

In another example, the creating operation may include providing a shift register using the second signal as an input and the clock signal as the shift register clock input, the clock signal being of higher frequency than the frequency of the second signal, the shift register having two or more outputs, each output including a copy of the second signal shifted by one or more cycles of the clock signal. In one example, the determining operation may include providing a plurality of phase detectors, each phase detector receiving the first signal and receiving one of the shifted copies of the second signal, wherein the phase detector determines whether the first signal is substantially aligned with the shifted copy of the second signal.

The method may also include, after the determining operation, deactivating one or more of the phase detectors that determine that the first signal is not substantially aligned with the shifted copy of the second signal in order to reduce power consumption, and/or or deactivating one or more of the shifted copies created by the creating operation in order to reduce power consumption. The method may also include selecting as an output the shifted copy of the second signal that is substantially aligned with the first signal.

In one example, at least one of the phase detectors may include a flip-flop, and the plurality of phase detectors are arranged in parallel.

According to another broad aspect of one embodiment of the present invention, disclosed herein is a circuit for aligning two or more signals including a first and second signal. In one embodiment, the circuit may include a shift register generating two or more shifted copies of the second signal, and a plurality of phase detectors, each phase detector receiving the first signal and receiving one of the shifted copies of the second signal, each phase detector providing an output indicating whether the first signal is substantially aligned with the shifted copy of the second signal. The circuit may also include a multiplexer receiving each of the shifted copies of the second signal, the multiplexer having a plurality of select lines coupled with the output signals of the phase detectors. The circuit may also include means for deactivating one or more of the phase detectors that have determined that the first signal is not substantially aligned with the shifted copy of the second signal in order to reduce power consumption.

The shift register may have an input receiving the second signal and a clock input receiving a clock signal, the clock signal being of higher frequency than the frequency of the second signal, the shift register having two or more outputs, each output including a copy of the second signal shifted by one or more cycles of the clock signal. The two or more copies of the second signal may each be shifted by a different amount of time. For instance, the two or more copies of the second signal may each be shifted by one or more cycles of a clock signal, the clock signal being of higher frequency than the frequency of the second signal.

In one example, at least one of the phase detectors includes a flip-flop, and in another example, the phase detectors are arranged in parallel.

According to another broad aspect of one embodiment of the present invention, disclosed herein an integrated circuit which may include a circuit section for aligning two or more signals including a first and second signal. In one example, the circuit section of the integrated circuit may include a shift register generating two or more shifted copies of the second signal; a plurality of phase detectors, each phase detector receiving the first signal and receiving one of the shifted copies of the second signal, each phase detector providing an output indicating whether the first signal is substantially aligned with the shifted copy of the second signal; and a multiplexer receiving each of the shifted copies of the second signal, the multiplexer having a plurality of select lines coupled with the output signals of the phase detectors. The plurality of phase detectors may be arranged in parallel.

According to one embodiment, a method of aligning the edges of two synchronized signals to each other in a fast manner is described.

The features, utilities and advantages of the various embodiments of the invention will be apparent from the following more particular description of embodiments of the invention as illustrated in the accompanying drawings.

DETAILED DESCRIPTION

Embodiments of the present invention provide rapid alignment of two or more signals that have differing phases, delays or offsets (i.e., rising/leading edges that occur at different times, or falling/trailing edges that occur at different times). The signals being aligned may be clock signals or data signals, depending upon the implementation. For instance, embodiments of the present invention may be used to align two or more clock signals, which may be of different frequencies, and the alignments may result in an alignment of the leading edges of the signals, or if desired the alignment of the trailing edges of the signals. Through the use of embodiments of the present invention, the alignment of these two or more signals may occur very quickly, for instance within less than one cycle of either of the signals being aligned. Some embodiments may include a power saving mode.

Various embodiments of the present invention will now be described. For purposes of illustration only, embodiments of the present invention are described herein with reference to the alignment of two clock signals, CLK1 and CLK2, but it is understood that embodiments of the present invention may be used to align two or more non-clock-type signals if desired.

Figure 2:
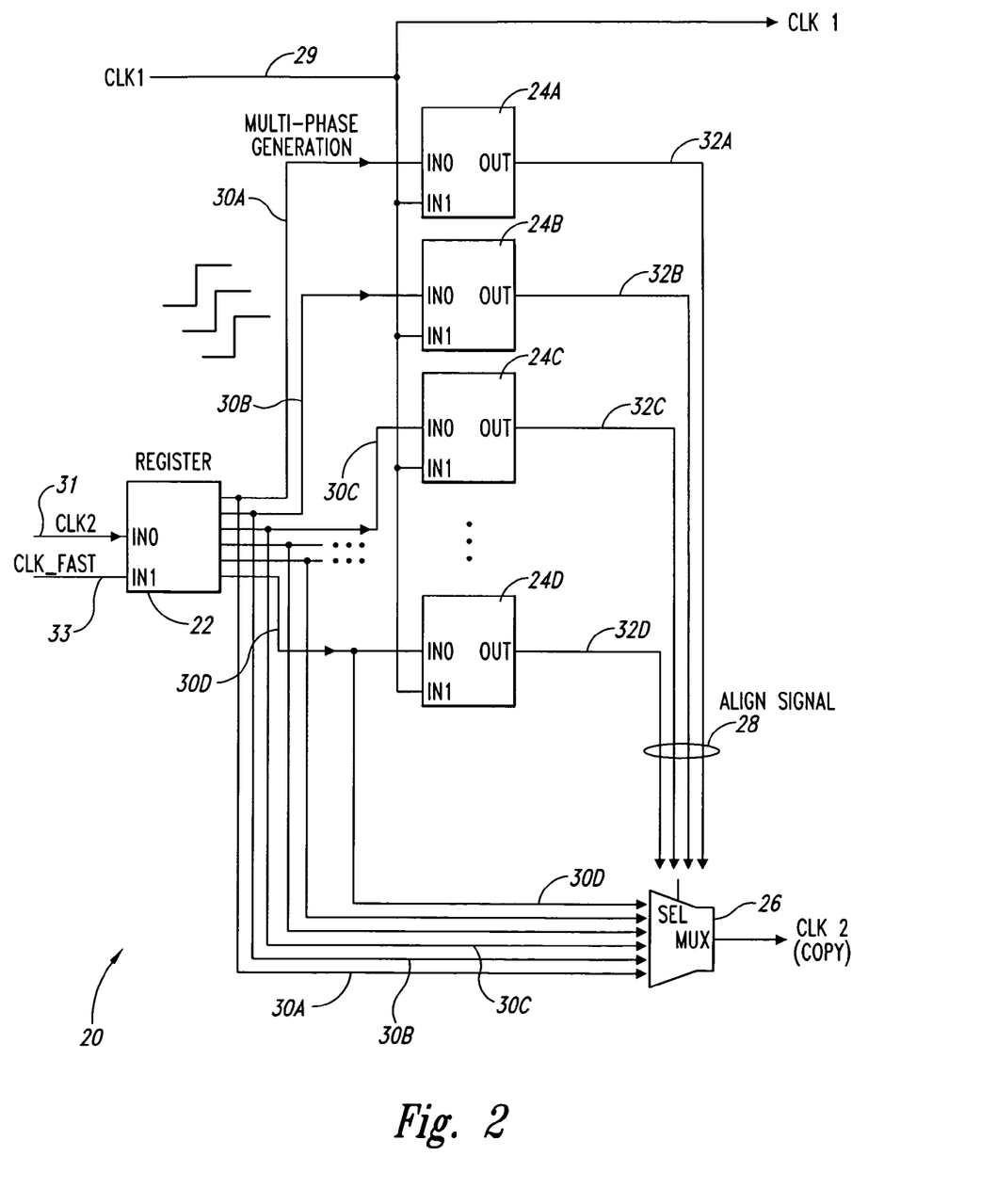
FIG. 2 illustrates an example of an alignment circuit, in accordance with one embodiment of the present invention.

FIG. 2 illustrates one example of an alignment circuit 20 for aligning two signals 29, 31 to one another, in accordance with one embodiment of the present invention. As will be described, alignment circuit 20 effectively aligns signal 29 to a delayed or shifted copy of signal 31. In FIG. 2, the two signals 29, 42 to be aligned to one another are represented by CLK1 and CLK2. A third signal, clock_fast (CLK_FAST), is shown and may, in one example, be generally of higher frequency than the two signals CLK1 and CLK2 being aligned. The signals being aligned are illustrated herein as being digital signals initially having different phases or not being aligned in time. The signals CLK1, CLK2 may have different frequencies. While the signals CLK1, CLK2 are shown and described herein as generally representing different clock signals, it is understood that these signals could be non-clock type signals that are in need of alignment.

In one example, alignment circuit 20 includes a shift register 22, a plurality of phase detectors 24A–24D, and multiplexer or other selection-logic 26. In one example, shift register 22 receives one of the signals 31 for alignment (CLK2) as well as a clock signal 33 shown as clock fast (CLK_FAST). The shift register 22 provides a plurality of outputs 30A–D (in this case, shift register 22 provides four outputs) wherein each output is a copy of the CLK2 input signal delayed by multiples of the clock cycles of the CLK_FAST signal.

Figure 4:
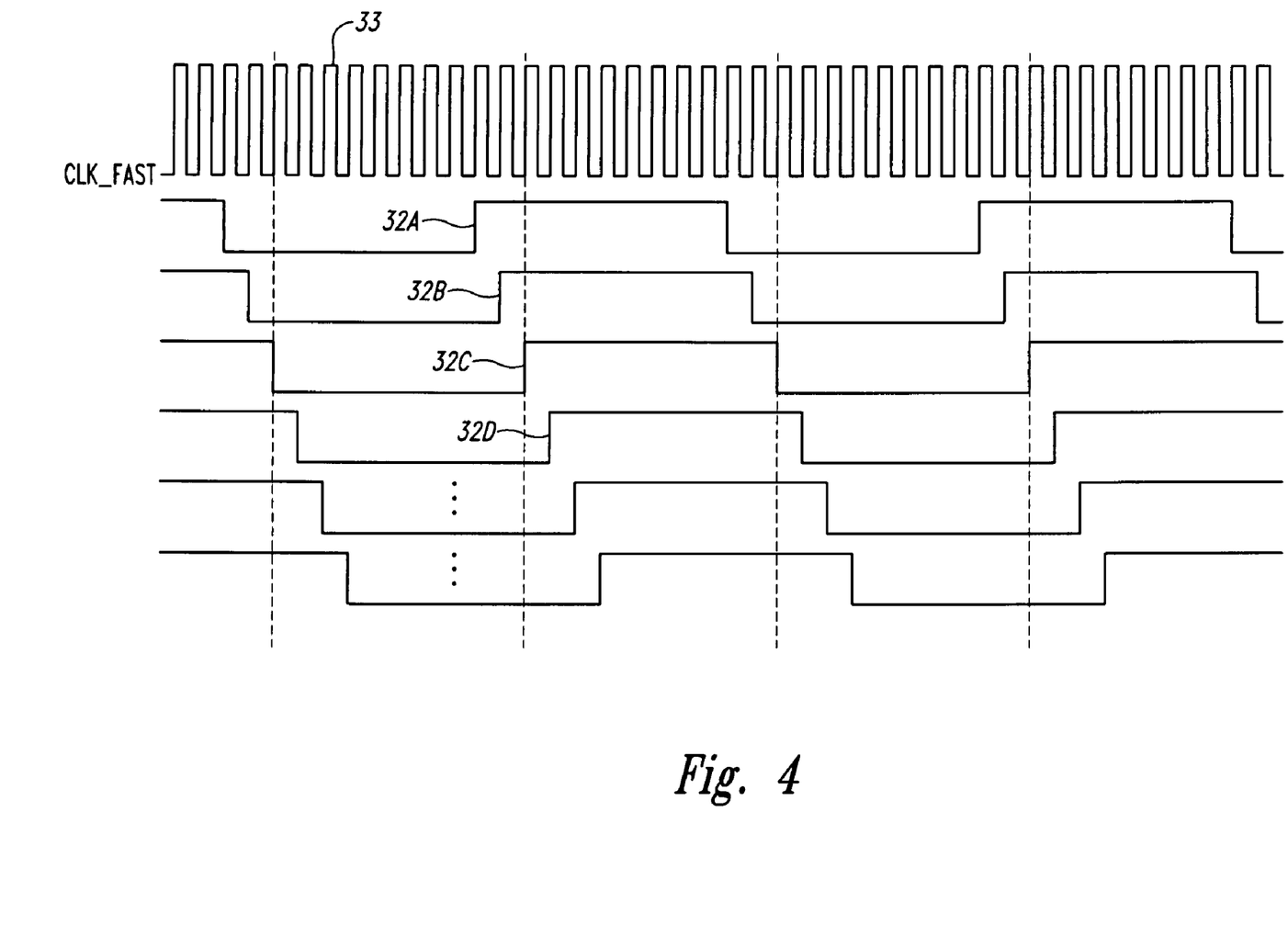
FIG. 4 illustrates an example of waveforms generated by the circuit of FIG. 2, in accordance with one embodiment of the present invention.
Figure 5:
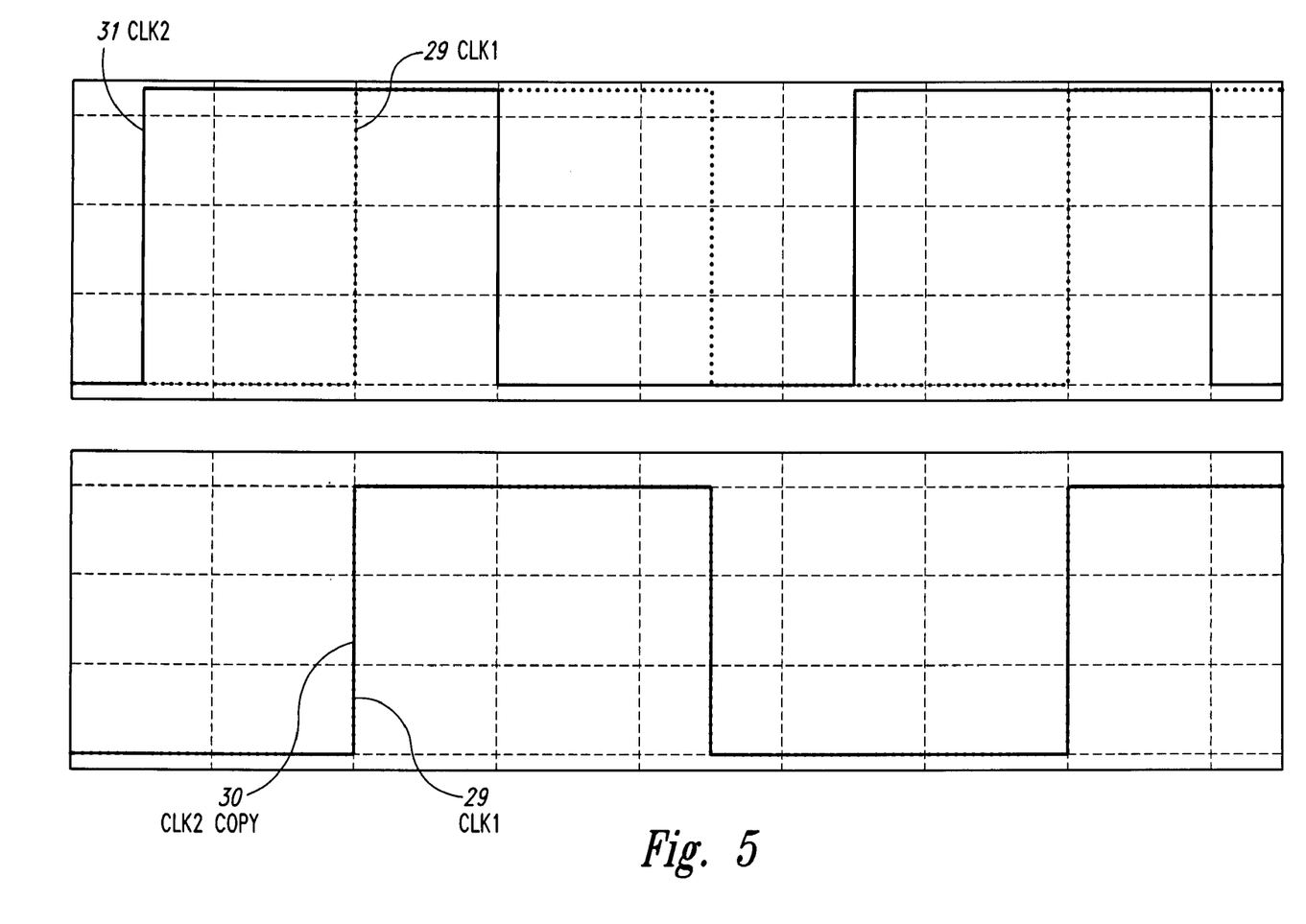
FIG. 5 illustrates an example of waveforms generated by the circuit of FIG. 2, in accordance with one embodiment of the present invention.

In the example of FIG. 2, shift register 22 provides outputs 30A, 30B, 30C, 30D. Output 30A may be a copy of the CLK2 signal delayed by one clock cycle dictated by the CLK_FAST frequency; output 30B may be a copy of the CLK2 signal delayed by two clock cycles dictated by the CLK_FAST frequency; output 30C may be a copy of the CLK2 signal delayed by three clock cycles dictated by the CLK_FAST frequency; and output 30D may be a copy of the CLK2 signal delayed by four clock cycles as dictated by the CLK_FAST frequency. Hence, shift register 22 generates multiple copies of the CLK2 signal, each copy having a different amount of phase, offset or delay. FIG. 4 illustrates an example of the outputs that may be provided by shift register 22, and it can be seen that the various outputs 30A–D have differing phases, delays or time offsets.

Figure 3:
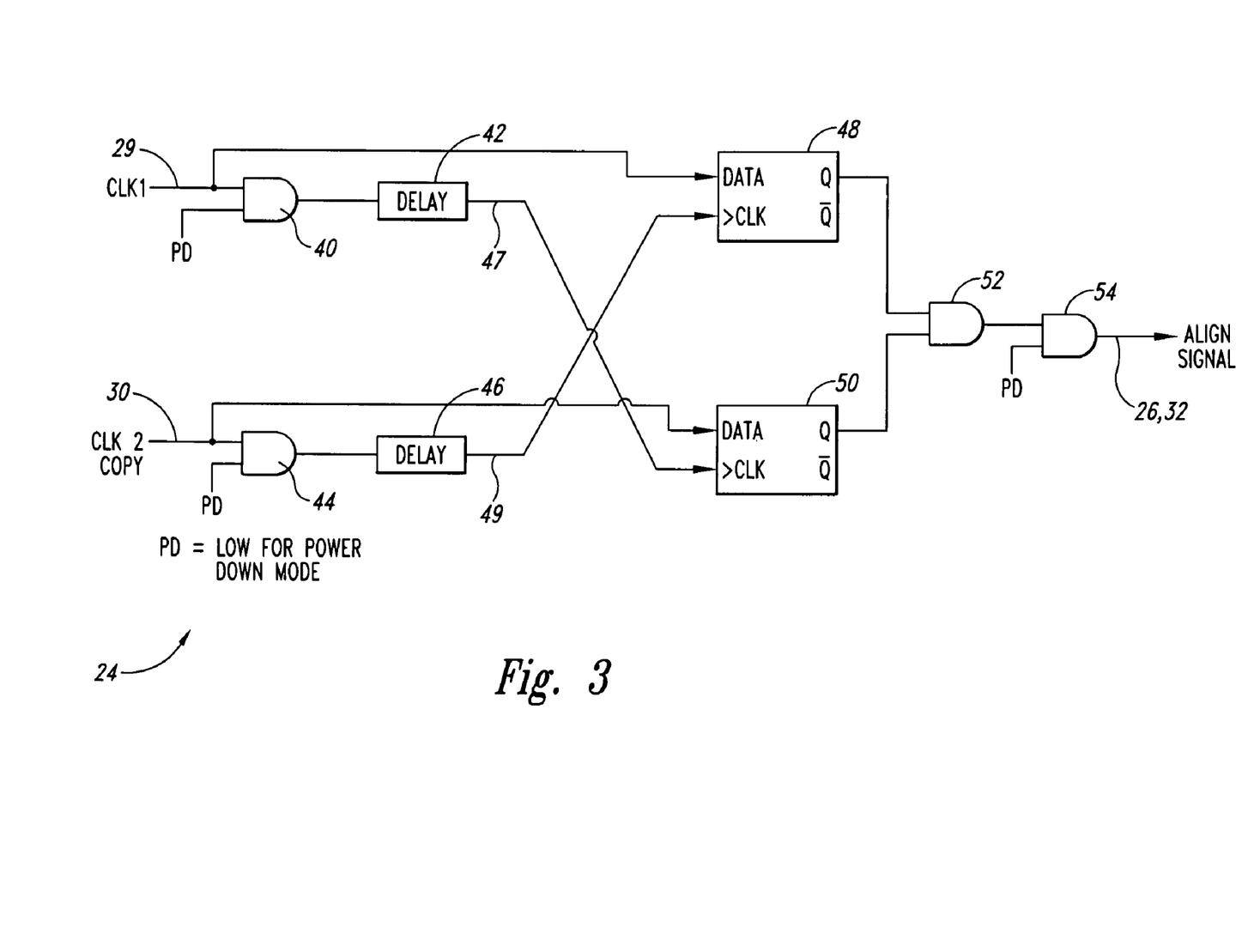
FIG. 3 illustrates an example of a phase detector, which may be used in the alignment circuit of FIG. 2, in accordance with one embodiment of the present invention.

A plurality of phase detectors 24A–24D are provided in parallel, wherein each phase detector receives the CLK1 signal as well as one of the copies 30A–D of the CLK2 signal generated by shift register 22. Phase detectors 24A–24D may include any conventional phase detector or phase comparators, or may alternatively be implemented by other logic which detects alignment between two signals, such as alignment of rising edges or falling edges of the two signals. One example of a phase detector is illustrated in FIG. 3, described below.

In one example, each of the phase detectors 24A–D determines whether the phase of the signals input to the phase detector are aligned, and if so, the output 32A–D of a particular phase detector 24A–D goes high. Because each phase detector is comparing the CLK1 signal to a copy of the CLK2 signal having differing delays or offsets, only one of the phase detectors 24A–D will detect a match at any given time, and accordingly, only one of the outputs 32A–32D will be active at any particular time. These outputs 32A–D indicate alignment as signals 28.

For instance, assuming that the CLK1, CLK2, and CLK_FAST signals, each have substantially constant (but different) frequencies, one of the phase detectors 24A–24D will detect a phase match between the CLK1 signal and one of the outputs of the shift registers 30A–30D, and accordingly this particular shift register will have its output active while the other phase detectors will have their output inactive.

A multiplexer 26 (or other conventional selection logic) may be provided having a plurality of inputs, which are coupled with the outputs 30A–30D of the shift register 22. The select lines of the multiplexer may be coupled with the outputs 32A–32D of the phase detectors 24A–24D. The configuration of multiplexer 26 can be provided such that when an output 32A–32D of a particular phase detector 24A–24D is active, the corresponding input signal 30A–30D is selected by the multiplexer 26 and output as the CLK2 signal from the multiplexer. For instance, if phase detector 24C determines that the shift register output signal 30C matches the phase of the CLK1 signal, the output signal 32C of phase detector 24C is active and selects, through multiplexer 26, that the signal 30C be passed through the multiplexer as the output, CLK2 (copy). Hence, the output of the multiplexer 26 is the particular delayed, shifted copy (i.e., either 30A, B, C, or D) of the CLK2 signal, which is in phase alignment with the CLK1 signal.

Stated differently, in FIG. 2, the shift register 22, clocked by fast clock 33, generates multiple CLK2 phases. The parallel phase detectors 24A–D determine which CLK2 phase is most closely aligned to CLK1, and the multiplexer selects the correct CLK2 phase to output. An advantage of the circuit 20 of FIG. 26 is the parallel structure, which yields immediate phase information. Shift register 22 clocks-in clock CLK2 signal 31 using the faster clock 33. Each branch of the shift-register 22 now has the signal 31 on it, but it is shifted in phase according to the fast clock 33 (shifted by one period of the CLK_FAST 33). Each of the phases of CLK2 is compared to CLK1. The comparisons may be done using several parallel phase detectors 24A–D. The phase that is aligned with CLK2 is noted when the output of a phase detector 24A–C goes high. The output of the phase detectors receiving misaligned phases stays low. The logic state of each of the phase-detectors is taken into a logic block and/or mux 26. The mux 26 selects the correct aligned-phase signal generated by the shift-register 22. The unused portion of the shift register 22 can now be turned off. This is not required to maintain phase alignment, but is practical for power savings since the fast phase alignment operation is typically only required for a short period of time.

The number of phase detectors 24A–D utilized in a particular embodiment will vary and may depend on the frequency ratio between the CLK1 signal when compared with the CLK_FAST signal, in one example. Generally, a greater number of phase detectors provides for a greater degree of precision and accuracy in the alignment of the signals.

FIG. 3 illustrates an example of a phase detector 24, in accordance with one embodiment of the present invention. In this example, a power down feature is provided so that the phase detector 24 can be placed in a very low power mode if desired. It is understood that the power down feature is optional depending upon the implementation. In this example, when the power down signal PD shown in FIG. 3 is low, the circuit 24 does not switch or change states even though the inputs CLK1, CLK2 are changing state, and therefore the phase detector 24 saves power.

In FIG. 3, AND gate 40 receives the CLK1 signal 29 and a power down signal PD, and the output of AND gate 40 is coupled with a delay block 42. AND gate 44 receives the CLK2 signal copy 30 and the power down signal, and provides an output coupled with delay 46. Delays 42, 46 may be implemented in any conventional manner, such as through the use of buffers or inverters.

Flip-flops 48, 50 are provided and in one example may be D flip-flops. Flip-flop 48 receives as data the CLK1 signal and receives as a clock signal the output 49 of delay block 46. Flip-flop 50 receives as data the CLK2 signal, and receives as a clock signal the output 47 of delay 42. The outputs of flip-flops 48, 50 are provided to AND gate 52 whose output is coupled with AND gate 54 which also receives the power down signal.

AND gate 54 provides an output which may be used as the alignment detection signal 26, 32 shown in FIG. 2. If the input signals CLK1, CLK2 copy (from the output of shift register 22) are aligned, then the output signal 32 will be high (assuming the power down signal is high); but if the input signals CLK1, CLK2 copy are not aligned, then the output signal 32 will be low. Also, if the power down signal PD is low, then the output 32 of the phase detector 24 will be low.

Figure 6:
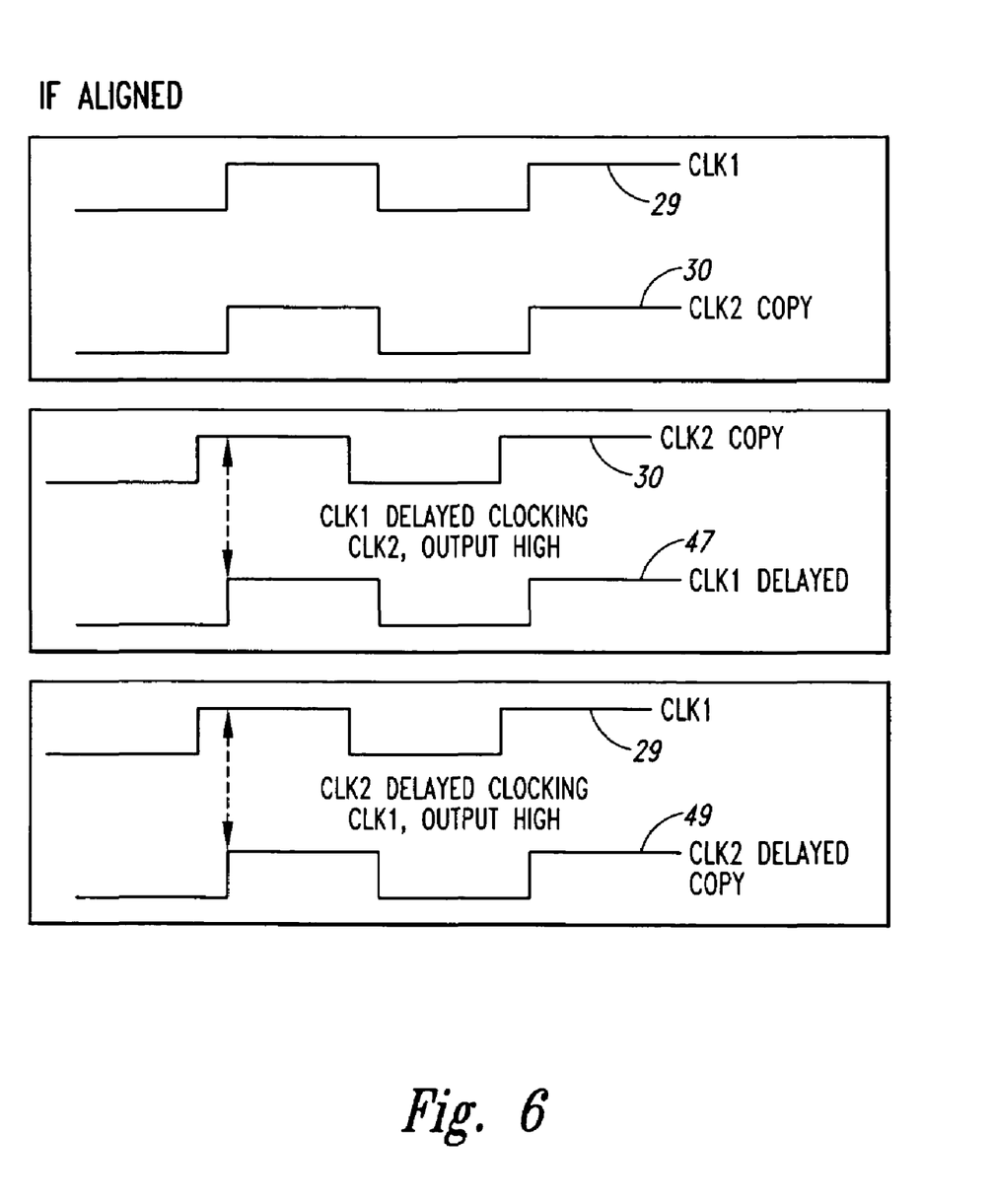
FIG. 6 illustrates example waveforms that show the operation of the circuits of FIGS. 2–3 when alignment is detected, in accordance with one embodiment of the present invention.

For the phase detector operation, assume that signals 30, 29 are aligned, as shown in FIG. 6. The delayed signal clocks the other signal. The output of AND gate 52 can be high only if the delayed clock 47, 49 hits a high. If the signals 30, 29 are not aligned as shown in FIG. 7, the rising edge of the delayed clock will land before the rising edge of the non-delayed clock resulting in a low output of AND gate 52.

In one example, when one of the phase detectors 24A–D has detected a phase match, the other phase detectors may be powered down in order to reduce power consumption. Furthermore, logic and signaling may be provided to instruct the shift register 22 to deactivate the outputs 30A–D which are not aligned with the CLK1 signal, and this may provide further reductions in power consumption.

Figure 7:
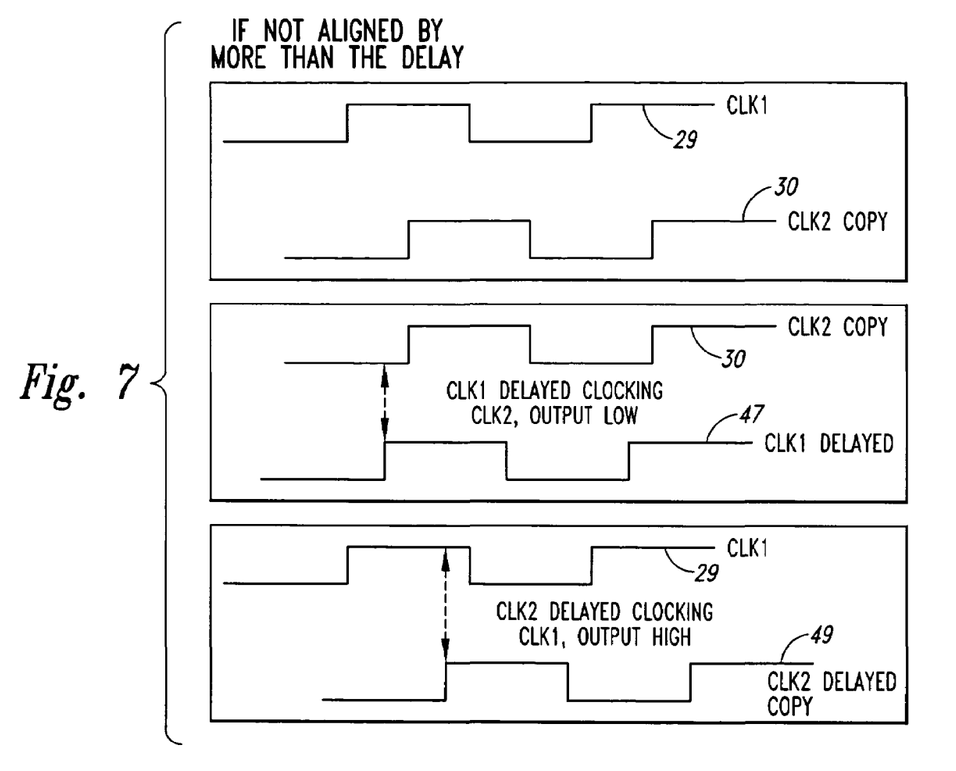
FIG. 7 illustrates example waveforms that show the operation of the circuits of FIGS. 2–3 when non-alignment is detected, in accordance with one embodiment of the present invention.

FIGS. 6 and 7 illustrate examples of operations of the phase detector 24 of FIG. 3 when the inputs CLK1 (29) and CLK2 copy (30) are aligned (FIG. 6) or are not aligned (FIG. 7). In FIG. 6, as between signals CLK2 copy (30) and CLK1 delayed (47) the output of flip-flop 48 will be high; and as between signals CLK1 (29) and CLK2 copy delayed (49), the output of flip-flop 50 is high. Because the outputs of both flip-flops 48, 50 are high, the output of AND gates 52 and 54 of FIG. 3 will also be high (assuming the power down signal is high) hence indicating signal alignment between CLK1 (29) and CLK2 copy (30).

In FIG. 7, as between signals CLK2 copy (30) and CLK1 delayed (47), the output of flip-flop 48 will be low. Accordingly, the output of AND gates 52 and 54 will also be low, which indicates that the input signals CLK1 (29) and CLK2 copy (30) are not aligned.

Figure 8:
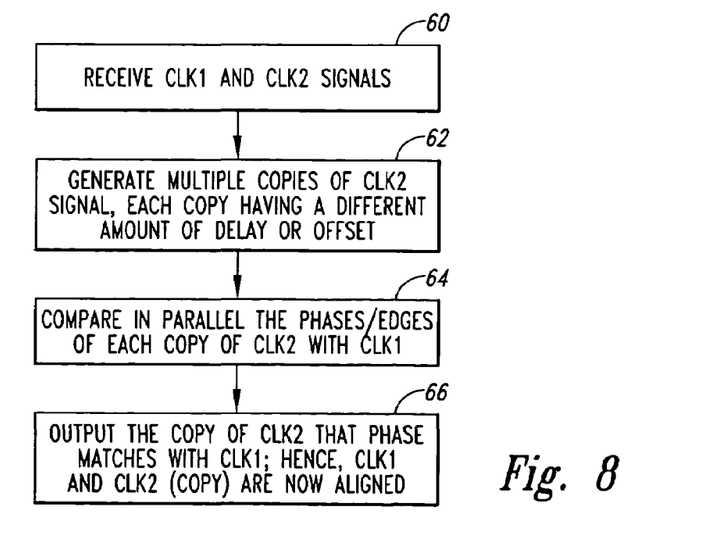
FIG. 8 illustrates an example of operations for aligning two signals, in accordance with one embodiment of the present invention.

FIG. 8 illustrates an example of operations for providing rapid alignment of two or more digital signals, in accordance with one embodiment of the present invention. In this example, the digital signals are referred to as CLK1 and CLK2, but it is understood, as explained above, that the digital signals may be other non-clock type signals. In one example, the method includes creating a delayed or shifted copy of one of the signals (e.g., CLK2) in order to be aligned with the other signal (e.g., CLK1).

Referring to FIG. 8, at operation 60, the signals (e.g., CLK1, CLK2) for alignment are received. At operation 62, multiple copies of one of the signals (e.g., CLK2) are generated, each copy having a different amount of delay or offset. Stated differently, operation 62 may shift an edge (e.g., a rising or falling edge) of a signal, such as the CLK2 signal, relative to another signal, such as the CLK1 signal, by a desired amount.

Operation 64 compares in parallel the phases/edges of each copy of the signals generated by operation 62 (e.g., CLK2 copies) with the phases/edges of other signals (e.g., CLK1). Operation 66 outputs or selects the copy of the CLK2 signal that phase matches or is aligned with the CLK1 signal. Hence, the CLK1 signal is now aligned with the particular copy of the CLK2 signal.

Hence, it can be seen that embodiments of the present invention provide for rapid alignment of two or more signals. Embodiments of the present invention may be utilized in various different circuits and applications. For instance, it may be useful to align the various clocks that are generated from a main clock of a digital phase lock loop.

Advantages of embodiments of the present invention may include that the alignment operation can be performed in a rapid, parallel manner, and further that no counter is necessarily required, and that embodiments can include low power provisions.

In an alternate embodiment, instead of a shift register 22, a multi-phase output module can be used if applicable, for example in a multi-phase voltage controller oscillator (VCO), multi-phase counter or other suitable application. In another embodiment, parallel registers can be used if there are already have several available clock phases (such as an invert which gives 180 degrees offset). In another embodiment, the logic and multiplexer 26 can be integrated into one module for a more generic representation, and the parallel phase-detectors 24A–D can be implemented as one module. In yet another embodiment, the signal that forces the shift-register 22, phase detectors 24A–D and the mux 26 to stop updating, can be generated externally if desired.

Embodiments of the present invention may be used in various semiconductors, memories, processors, controllers, integrated circuits, logic or programmable logic, clock circuits, and the like.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included, if desired, in at least one embodiment of the present invention. Therefore, it should be appreciated that two or more references to "an embodiment" or "one embodiment" or "an alternative embodiment" or "one example" or "an example" in various portions of this specification are not necessarily all referring to the same embodiment. Furthermore, the particular features, structures or characteristics may be combined as desired in one or more embodiments of the invention.

It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

While the invention has been particularly shown and described with reference to embodiments thereof, it will be understood by those skilled in the art that various other changes in the form and details may be made without departing from the spirit and scope of the invention.

What is claimed is:

1. A method for aligning a first signal with a second signal, comprising:
   creating two or more shifted copies of the second signal; and
   determining which of the shifted copies of the second signal are substantially aligned with the first signal,
   wherein the two or more copies of the second signal are each shifted by one or more cycles of a clock signal, the clock signal being of higher frequency than a frequency of the second signal.

2. The method of claim 1, wherein the two or more copies of the second signal are each shifted by a different amount of time.

3. A method for aligning a first signal with a second signal, comprising:
   creating two or more shifted copies of the second signal; and
   determining which of the shifted copies of the second signal are substantially aligned with the first signal,
   wherein the creating operation further comprises: providing a shift register having an input receiving the second signal and a clock input receiving a clock signal, the clock signal being of higher frequency than a frequency of the second signal, the shift register having two or more outputs, each output including a copy of the second signal shifted by one or more cycles of the clock signal.

4. The method of claim 1, wherein the determining operation further comprises:
   providing a plurality of phase detectors, each phase detector receiving the first signal and receiving one of the shifted copies of the second signal, wherein the phase detector determines whether the first signal is substantially aligned with the shifted copy of the second signal.

5. The method of claim 4, wherein at least one of the phase detectors includes a flip-flop.

6. The method of claim 4, further comprising:
   after the determining operation, deactivating one or more of the phase detectors that determine that the first signal is not substantially aligned with the shifted copy of the second signal in order to reduce power consumption.

7. The method of claim 4, wherein the plurality of phase detectors are arranged in parallel.

8. The method of claim 1, further comprising:
   selecting as an output the shifted copy of the second signal that is substantially aligned with the first signal.

9. The method of claim 1, further comprising:
after the determining operation, deactivating one or more of the shifted copies created by the creating operation in order to reduce power consumption.

10. A circuit for aligning two or more signals including a first and second signal, the circuit comprising:
a shift register generating two or more shifted copies of the second signal;
a plurality of phase detectors, each phase detector receiving the first signal and receiving one of the shifted copies of the second signal, each phase detector providing an output indicating whether the first signal is substantially aligned with the shifted copy of the second signal; and
a multiplexer receiving each of the shifted copies of the second signal, the multiplexer having a plurality of select lines coupled with the output signals of the phase detectors.

11. A circuit for aligning two or more signals including a first and second signal, the circuit comprising:
a shift register generating two or more shifted copies of the second signal; and
a plurality of phase detectors, each phase detector receiving the first signal and receiving one of the shifted copies of the second signal, each phase detector providing an output indicating whether the first signal is substantially aligned with the shifted copy of the second signal,
wherein the shift register has an input receiving the second signal and a clock input receiving a clock signal, the clock signal being of higher frequency than a frequency of the second signal, the shift register having two or more outputs, each output including a copy of the second signal shifted by one or more cycles of the clock signal.

12. The circuit of claim 10, wherein the two or more copies of the second signal are each shifted by a different amount of time.

13. A circuit for aligning two or more signals including a first and second signal, the circuit comprising:
a shift register generating two or more shifted copies of the second signal; and
a plurality of phase detectors, each phase detector receiving the first signal and receiving one of the shifted copies of the second signal, each phase detector providing an output indicating whether the first signal is substantially aligned with the shifted copy of the second signal,
wherein the two or more copies of the second signal are each shifted by one or more cycles of a clock signal, the clock signal being of higher frequency than a frequency of the second signal.

14. The circuit of claim 10, wherein at least one of the phase detectors includes a flip-flop.

15. The circuit of claim 10, wherein the plurality of phase detectors are arranged in parallel.

16. The circuit of claim 10, further comprising:
means for deactivating one or more of the phase detectors that have determined that the first signal is not substantially aligned with the shifted copy of the second signal in order to reduce power consumption.

17. An integrated circuit, comprising:
a circuit section for aligning two or more signals including a first and second signal, the circuit section comprising:
a shift register generating two or more shifted copies of the second signal;
a plurality of phase detectors, each phase detector receiving the first signal and receiving one of the shifted copies of the second signal, each phase detector providing an output indicating whether the first signal is substantially aligned with the shifted copy of the second signal; and
a multiplexer receiving each of the shifted copies of the second signal, the multiplexer having a plurality of select lines coupled with the output signals of the phase detectors.

18. The integrated circuit of claim 17, wherein the plurality of phase detectors are arranged in parallel.

* * * * *